United States Patent
Kim

(10) Patent No.: US 8,864,357 B2
(45) Date of Patent: Oct. 21, 2014

(54) LIGHT EMITTING DEVICE AND LIGHT UNIT HAVING THE SAME

(75) Inventor: Tae Ho Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 566 days.

(21) Appl. No.: 13/074,929

(22) Filed: Mar. 29, 2011

(65) Prior Publication Data

US 2011/0242840 A1 Oct. 6, 2011

(30) Foreign Application Priority Data

Mar. 30, 2010 (KR) .................. 10-2010-0028252

(51) Int. Cl.
*F21V 7/04* (2006.01)
*H01L 33/60* (2010.01)
*F21V 8/00* (2006.01)

(52) U.S. Cl.
CPC ............ *G02B 6/0073* (2013.01); *G02B 6/0068* (2013.01); *G02B 6/0021* (2013.01); *H01L 33/60* (2013.01); *G02B 6/0091* (2013.01); *G02B 6/009* (2013.01)
USPC ...... 362/608; 362/612; 362/97.3; 362/296.05

(58) Field of Classification Search
USPC ........... 362/606, 612, 608, 613, 249.02, 97.3, 362/296.05
See application file for complete search history.

(56) References Cited

U.S. PATENT DOCUMENTS

| | | | |
|---|---|---|---|
| 7,293,906 B2 | 11/2007 | Mok et al. | |
| 2008/0253952 A1 | 10/2008 | Hiramatsu et al. | |
| 2011/0013422 A1* | 1/2011 | Hsu et al. | 362/612 |
| 2011/0164204 A1* | 7/2011 | Kim et al. | 349/65 |
| 2012/0014134 A1* | 1/2012 | Fang et al. | 362/612 |
| 2012/0081918 A1* | 4/2012 | Yang et al. | 362/608 |
| 2012/0147625 A1* | 6/2012 | Yang et al. | 362/612 |
| 2012/0182482 A1* | 7/2012 | Byoun et al. | 348/725 |

FOREIGN PATENT DOCUMENTS

| | | |
|---|---|---|
| JP | 7-235207 A | 9/1995 |
| JP | 2005-79038 A | 3/2005 |
| JP | 2006-28310 A | 2/2006 |
| JP | 2008-108994 A | 5/2008 |
| JP | 4182848 B2 | 11/2008 |
| JP | 2009-99316 A | 5/2009 |
| JP | 2010-50498 A | 3/2010 |
| KR | 10-2006-0111772 A | 10/2006 |
| KR | 10-2006-0121701 A | 11/2006 |
| KR | 10-2009-0023795 A | 3/2009 |
| KR | 10-0890950 B1 | 3/2009 |
| KR | 10-2009-0128693 A | 12/2009 |
| KR | 10-2010-0001545 A | 1/2010 |

* cited by examiner

*Primary Examiner* — Jong-Suk (James) Lee
*Assistant Examiner* — Leah S Macchiarolo
(74) *Attorney, Agent, or Firm* — Birch, Stewart, Kolasch & Birch, LLP

(57) ABSTRACT

Disclosed are a light emitting device and a light unit including the same. The light emitting device includes a body having a cavity with an open upper portion, a protrusion protruding from an upper portion of the body, a plurality of lead electrodes in the cavity, and a light emitting diode provided in the cavity and electrically connected to the lead electrodes.

20 Claims, 8 Drawing Sheets

LIGHT EMITTING DEVICE AND LIGHT UNIT HAVING THE SAME

The present application claims priority of Korean Patent Application No. 10-2010-0028252 filed on Mar. 30, 2010, which is hereby incorporated by reference in its entirety.

BACKGROUND

The embodiment relates to a light emitting device and a light unit having the same.

Recently, since a liquid crystal display (LCD) extensively used as a flat panel display is a non-emissive device, a backlight assembly is attached to the rear surface of a liquid crystal display panel to serve as a light source so that an image can be displayed. Accordingly, the whole characteristics of the LCD may vary according to the structures of the backlight assembly.

The backlight assembly is classified into an edge-type backlight assembly, which requires a light guide plate to change a linear light into a surface light because a lamp is mounted at the side of a display surface, and a direct-type backlight assembly, which does not require the light guide plate because the lamp is mounted under the display surface, according to the positions of the light source with respect to the display surface.

SUMMARY

The embodiment provides a light emitting device having a new structure.

The embodiment provides a light emitting device having a protrusion to reflect a light emitted from a light exit surface.

The embodiment provides a light emitting device having a protrusion more protruding from a portion of a top surface of a body than another surface of the body in a light exist direction.

The embodiment provides a light unit in which one of a light guide plate and a light emitting device has a protrusion.

The embodiment provides a light unit capable of reducing light loss in the vicinity of a light incident part of a light guide plate.

The embodiment provides a light unit capable of reducing light leakage in the vicinity of a light incident part of a light guide plate by a protrusion protruding from the light guide plate or a light emitting device.

According to the embodiment, a light emitting device includes a body having a cavity, a protrusion formed at a portion of top surface of the body, a plurality of lead electrodes in the cavity, and a light emitting diode provided in the cavity and electrically connected to the lead electrodes.

According to the embodiment, a light unit includes a light guide plate, a light emitting module including a plurality of light emitting devices facing at least one lateral surface of the light guide plate and a board having the plurality of light emitting devices mounted thereon, and a reflective member under the light guide plate. The light emitting device includes a body having a cavity with an opened upper portion, a protrusion protruding from an upper portion of the body, a plurality of lead electrodes in the cavity, and a light emitting diode provided in the cavity and electrically connected to the lead electrodes. The cavity of the light emitting device faces at least one lateral surface of the light guide plate.

According to the embodiment, a light unit includes a light guide plate, a light emitting module including a plurality of light emitting devices corresponding to at least one lateral surface of the light guide plate and a board having the plurality of light emitting devices mounted thereon, and a reflective member under the light guide plate. A protrusion is disposed on at least one side of the light guide plate while extending a side of the light emitting devices.

DETAILED DESCRIPTION OF THE EMBODIMENTS

Figure 1:
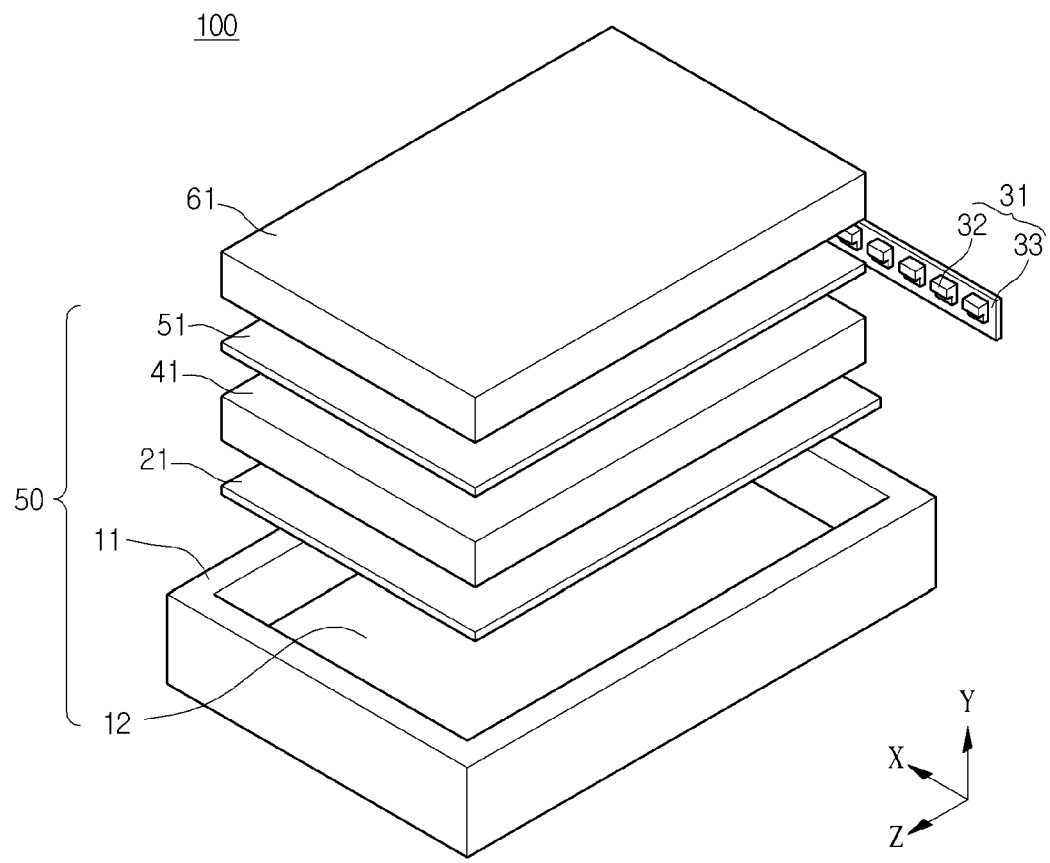
FIG. 1 is a perspective view showing a display apparatus according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 2:
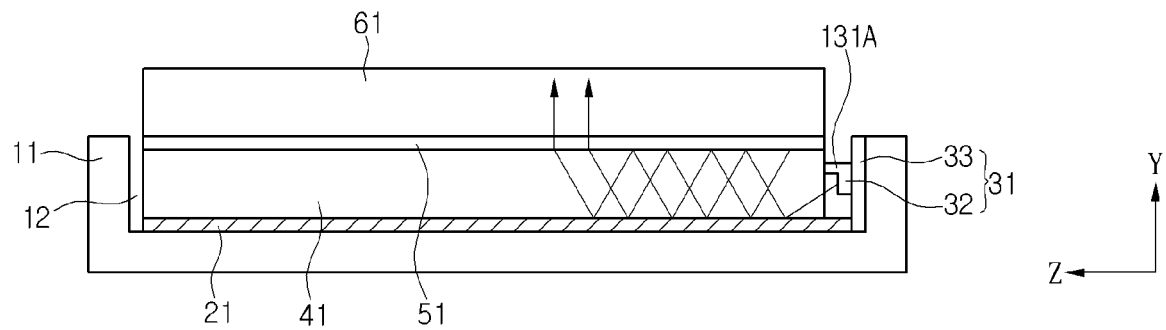
FIG. 2 is a side sectional view showing the assembly of FIG. 1.

FIG. 1 is a perspective view showing a display apparatus 100 according to a first embodiment, and FIG. 2 is a side sectional view showing the assembly of FIG. 1.

Referring to FIGS. 1 and 2, the display apparatus 100 includes a bottom cover 11, a reflective member 21, a light emitting module 31, a light guide plate 41, an optical sheet 51, and a display panel 61. The bottom cover 11, the reflective member 21, the light emitting module 31, the light guide plate 41, and the optical sheet 51 may be defined as a light unit 50.

The display panel 61 may include an LCD panel. The display panel 61 includes first and second substrates and a liquid crystal layer interposed between the first and second substrates. A polarizing plate may be attached on at least one surface of the display panel 61, but the embodiment is not limited thereto. The display panel 61 displays information by a light passing through the optical sheet 51. Such a display apparatus 100 is applicable to a cellular phone, a portable terminal, a monitor of a lap-top computer, a TV, and the like.

The optical sheet 51 includes at least one transmissive sheet. The optical sheet 51 includes a plurality of optical sheets such as a diffusion sheet, horizontal and vertical prism sheets, or a brightness enhancement sheet. The diffusion sheet diffuses an incident light, and the horizontal and/or vertical prism sheet concentrates the incident light into a display region. The brightness enhancement sheet reuses a light to be lost to improve the brightness of the light. In addition, the display panel 61 may be provided thereon with a protective sheet, but the embodiment is not limited thereto.

The light guide plate 41 is provided under the optical sheet 51 to guide the incident light onto the whole region so that the incident light is output as a surface light.

The light guide plate 41 includes a transmissive material. For example, the light guide plate 41 may include one selected from the group consisting of acryl-based resin such as polymethyl methacrylate (PMMA), polyethylene terephthalate (PET), polycarbonate (PC), and polyethylene naphthalate (PEN) resin.

The light guide plate 41 may have a substantially rectangular plate. According to another embodiment, the shape of the light guide plate 41 may vary according to the shape of a target region such as a display panel.

The light guide plate 41 guides a light incident from a light emitting device toward the display panel 61 and changes the light into a surface light. The lower surface of the light guide plate 41 may include a reflective pattern, and the top surface of the light guide plate 41 may have a flat structure without a pattern, or a prism pattern.

The reflective member 21 is provided under the light guide plate 41, and interposed between the bottom cover 11 and the light guide plate 41. The light guide plate 41 may include PET, PC, or PVC resin, but the embodiment is not limited thereto. The reflective member 21 reflects a light leaking under the light guide plate 41 to improve the brightness of the light unit by the reflective light.

The reflective member 21 reflects a light getting out of the range of a light incident part of the light guide plate 41 among lights emitted from the light emitting device 32. Therefore, the loss of the light emitted from the light emitting device 32 can be reduced, so that the overall brightness can be improved.

A portion of the reflective member 21 may be provided under the light emitting module 31, but the embodiment is not limited thereto.

The light emitting module 31 is provided at least one lateral surface of the light guide plate 41, and corresponds to one lateral surface of the light guide plate 41. Preferably, a light exit surface of a light emitting device 32 corresponds to one lateral surface of the light guide plate 41. One lateral surface of the light guide plate 41 may serve as a light incident part, but the embodiment is not limited to such a term.

The bottom cover 11 may include a metallic material, or a non-metallic material representing a superior heat radiation property. The bottom cover 11 includes a recess part 12. The reflective member 21, the light guide plate 41, and the light emitting module 31 is provided in the recess part 12.

A lateral surface of the recess part 12 may be inclined or perpendicular to a bottom surface of the bottom cover 11, but the embodiment is not limited thereto. The bottom cover 11 is coupled with a top cover, which is not shown, and a coupling member may include a screw or a hook, but the embodiment is not limited thereto.

The light emitting module 31 includes a board 33 and a plurality of light emitting devices 32. The board 33 has the shape of a bar, and includes a metal PCB, a ceramic substrate, a rigid PCB, a resin substrate, a flexible substrate, or an FR-4 substrate, but the embodiment is not limited thereto.

For example, the board 33 may be arranged perpendicularly to an internal lateral surface of the bottom cover 11. The light emitting device 32 may be mounted on the board 33 in the form of a top-view-type light emitting device or a side-view-type light emitting device, but the embodiment is not limited thereto.

The light emitting devices 32 are arrayed on one surface of the board 33. The array direction of the light emitting devices 32 may correspond to one lateral surface of the light guide plate 41.

The light emitting devices 32 are arrayed at a predetermined pitch and may emit at least one of white, red, green, and blue lights. According to the embodiment, a target color can be realized by combining the light emitting devices 32 representing one color or different colors with each other and selectively using various types of chips and luminescence materials. The light emitting devices 32 may be arranged on a front surface of the board 33 in at least one row, but the embodiment is not limited thereto. The interval between the light emitting devices 32 may be regular or irregular. The board 33 may be fixed at the inner part of the bottom cover 11 by using an adhesive agent or a coupling unit.

Referring to FIGS. 2, the light emitting device 32 includes a protrusion 131A, and the protrusion 131A protrudes from one side of the light exit surface of the light emitting device 32. The protrusion 131A may make contact with one lateral surface of the light guide plate 41. The protrusion 131A reflects a portion of a light emitted from the light emitting device 32. Preferably, the protrusion 131A can prevent a light from leaking upward between the light emitting device 32 and the light guide plate 41. The light leakage refers to a phenomenon in which the light emitted from the light emitting device 32 is not incident into one lateral surface of the light guide plate 41.

Hereinafter, the light emitting device 32 will be described with reference to FIGS. 3 and 4 in detail.

Figure 3:
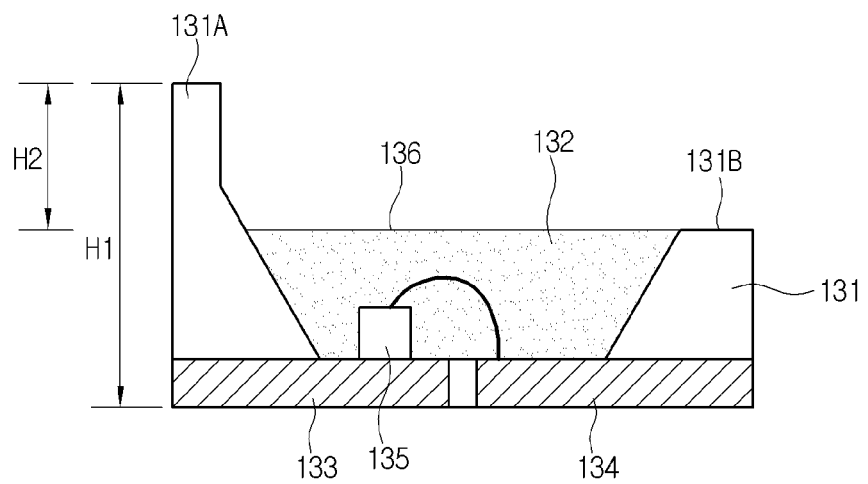
FIG. 3 is a side sectional view showing a light emitting device of FIG. 1.
Figure 4:
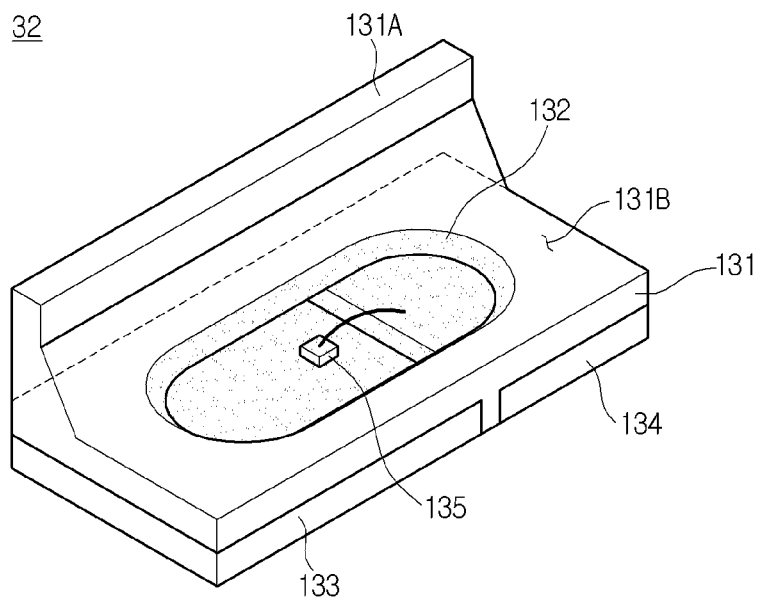
FIG. 4 is a perspective view of FIG. 3.

Referring to FIGS. 3 and 4, the light emitting device 32 includes a body 131 having a cavity 132 with an opened upper portion, the protrusion 131A protruding from one side of the top surface of the body 131 in the light exit direction, a plurality of lead electrodes 133 and 134, a light emitting diode 135 electrically connected to the lead electrodes 133 and 134, and a resin member 136 formed in the cavity 132.

The body 131 may include one selected from the group consisting of a silicon material, a ceramic material, and a resin material. For example, the body 131 may include at least one material selected from the group consisting of silicon, silicon carbide (SiC), aluminum nitride (AlN), polyphthalamide (PPA), and liquid crystal polymer (LCP), but the embodiment is not limited thereto. The body 131 may include a single layer substrate structure or a multi-layer substrate structure, or may be injection-molded, but the embodiment is not limited thereto.

The cavity 132 of the body 131 has a recess structure having an opening. The internal shape of the cavity 132 may include a concave cup shape or a concave tube shape having a predetermined curvature. The surface of the cavity 132 may have a circular shape or a polygonal shape, but the cavity 132 may have various surface shapes.

The lateral surface of the cavity 132 may be inclined outward with respect to a package bottom surface, and reflects an incident light toward the opening. The body 131 may include the protrusion 131A without the cavity 132, but the embodiment is not limited thereto.

The protrusion 131A is disposed at one part of the top surface of the body 131. The protrusion 131A more protrudes at one part of a light exit surface 131B than another region of the light exit surface 131B. The protrusion 131A protrudes in the light exit direction of the light emitting diode 135, and the protrusion direction of the protrusion 131A extends upward (that is, the light exit direction) from at least one lateral surface of the body 131. An outer lateral surface of the protrusion 131A is formed in a same plane with at least one of lateral surfaces of the body 131.

An outer lateral surface of the protrusion 131A may have a flat surface and an internal lateral surface of the protrusion 131A includes an inclined surface, a stepped surface, a curved surface and/or a flat surface. The internal lateral surface of the protrusion 131A may include an inclined surface at a lower portion thereof and a flat surface at an upper portion thereof. The lower portion of the protrusion 131A may be wider than the upper portion of the protrusion 131A. The lower portion of the protrusion 131A may be extended from the lateral surface of the cavity 132.

The inner side of the protrusion 131A extends to a portion of the cavity 132. The protrusion 131A more protrudes than the light exit surface 131B of the body 131 protrudes, so that the light emitted from the light emitting diode 135 can be reflected in another direction.

The protrusion 131A may extend from one lateral surface of the body 131, and the lateral surface of the body 131 may be a longer side of the body 131. According to another embodiment, the protrusion 131A may extend from a shorter side of the body 131. The length of the protrusion 131A may be equal to or shorter than the length of one lateral surface of the body 131. Preferably, the length of the protrusion 131A may be equal to the length of the longer side or the shorter side of the body 131. The length of the protrusion 131A may be longer than at least the length of the cavity 132. The height of the protrusion 131A may be formed in the thickness direction of the body 131, and the length of the protrusion 131A may be formed perpendicularly to the thickness direction of the body 131.

The protrusion 131A includes a same material that of the body 131, or a material representing 70% of light reflectance.

The distance H2 between the light exit surface 131B of the body 131 and the top surface of the protrusion 131A may be the height of the protrusion 131A, and may be greater than the thickness of the body 131. The thickness of the body 131 becomes a length obtained by subtracting the height H2 of the protrusion 131A from the distance H1 between the bottom surface of the body 131 and the top surface of the protrusion 131.

The lead electrodes 133 and 134 are provided at both sides of the body 131, and may be provided on the lower surface of the body 131. The lead electrodes 133 and 134 may be used as external electrodes.

The lead electrodes 133 and 133 may include a lead frame type electrode, a metallic thin film type electrode, or a PCB pattern type electrode. Hereinafter, the lead frame type electrode will be representatively described for the purpose of explanation.

The light emitting diode 135 may be attached to the first lead electrode 133 by using a conductive adhesive agent, and may be electrically connected to the second lead electrode 134 through a wire. The light emitting diode 135 may be mounted by selectively using a wire bonding scheme, a die bonding scheme, and a flip-bonding scheme. The bonding scheme may be changed according to the chip type and the positions of the electrodes on the chip.

The light emitting diode 135 may include a semiconductor light emitting device including a group III-V compound semiconductor, for example, a semiconductor compound including one selected from the group consisting of AlInGaN, InGaN, GaN, GaAs, InGaP, AlInGaP, InP, and InGaAs.

In addition, the light emitting diode 135 may include a blue LED chip, a yellow LED chip, a green LED chip, a red LED chip, a UV LED chip, an amber-colored LED chip, or a blue-green LED chip. The number and the type of the light emitting diodes 135 arranged in the light emitting device 32 may vary. In addition, if a plurality of light emitting diodes 135 are provided, lights having the same color spectrum can be emitted.

The resin member 136 is formed in the cavity 132. The resin member 136 may include a transparent resin material such as silicon or epoxy. In addition, the surface of the resin member 136 may have a flat shape, a concave shape, and a block shape, and a lens may be attached on the resin member 136.

At least one luminescence material may be added to the resin member 136. The luminescence material may include a yellow luminescence material or may include both of the yellow luminescence material and a red luminescence material. For the purpose of explanation, the light emitting diodes including a blue LED chip, and a yellow luminescence material or the mixed material of the yellow luminescence material and a red luminescence material will be described.

The light emitting devices 32 may be arrayed as shown in FIG. 1 by finely dividing the light emitting devices 32 according to a chromaticity ranks, light intensity ranks, and peak wavelength ranks based on optical characteristics and mixing the light emitting devices 32 with each other, but the embodiment is not limited thereto.

As shown in FIG. 2, the protrusion 131A of the light emitting device 32 can actually make contact with one lateral surface of the light guide plate 41 to reflect a light directed upward between the light guide plate 41 and the light emitting device 32. Accordingly, the light leakage caused by the interval between the light emitting device 32 and the light guide plate 41 can be reduced.

Figure 5:
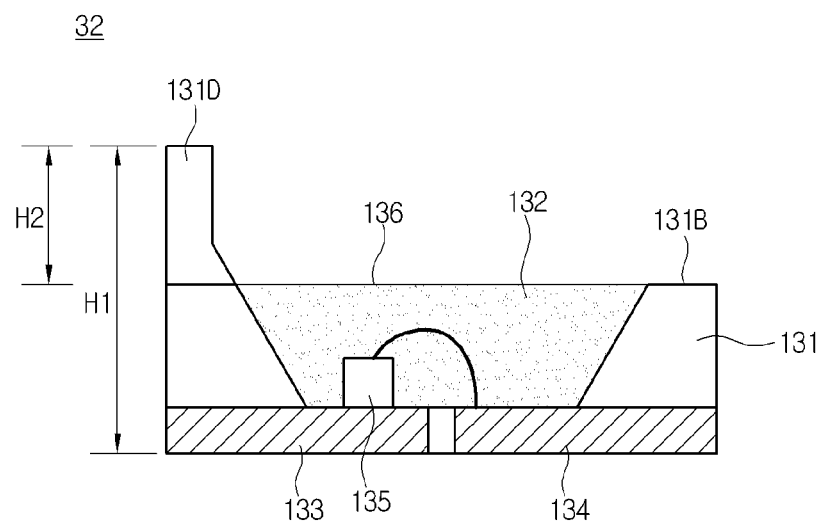
FIG. 5 is a side sectional view showing another light emitting device of FIG. 3.

FIG. 5 is a side sectional view showing another light emitting device of FIG. 3.

Referring to FIG. 5, a protrusion 131D protruding from the body 131 is separated from the body 131. The protrusion 131D may include a material different from that of the body 131, for example, a metallic material. The protrusion 131D may include at least one material selected from the group consisting of silicon, silicon carbide (SiC), aluminum nitride (AlN), polyphthalamide (PPA), and liquid crystal polymer (LCP), but the embodiment is not limited thereto.

Figure 6:
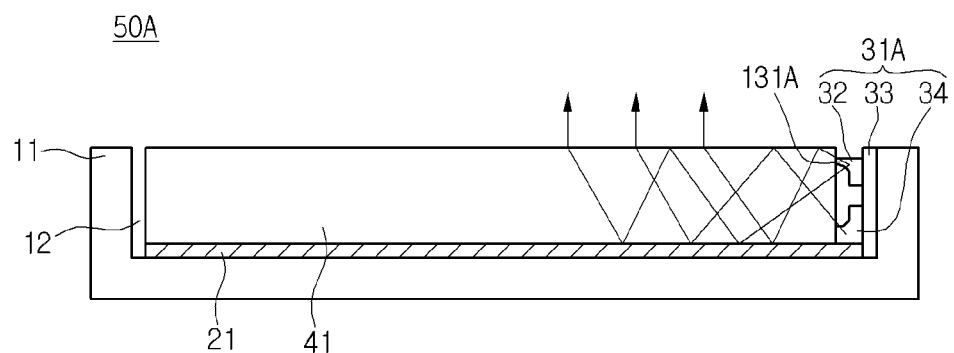
FIG. 6 is a side sectional view showing a light unit according to a second embodiment.

FIG. 6 is a view showing a light unit 50A according to the second embodiment. In the following description about the second embodiment, the structure and the components identical to those of the first embodiment will not be further described.

Referring to FIG. 6, a light emitting module 31A of the light unit 50A includes the first light emitting device 32 and a second light emitting device 34. The first light emitting device 32 is arrayed on an upper portion of one side of the board 33, and the second light emitting device 34 is arrayed on a lower portion of one side of the board 33.

The first and second light emitting devices 32 and 34 have the structure shown in FIG. 3, and internal lateral surfaces of protrusions 131A of the first and second light emitting devices 32 and 34 face each other. Accordingly, the protrusions 131A of the light emitting devices 32 and 34 reflect lights directed upward and downward from the light incident part of the light guide plate 41 so that the lights are guided toward the light incident part of the light guide plate 41.

Although the first and second light emitting devices 32 and 34 face each other, the first and second light emitting devices 32 and 34 may be provided at a zig-zag pattern, but the embodiment is not limited thereto.

Figure 7:
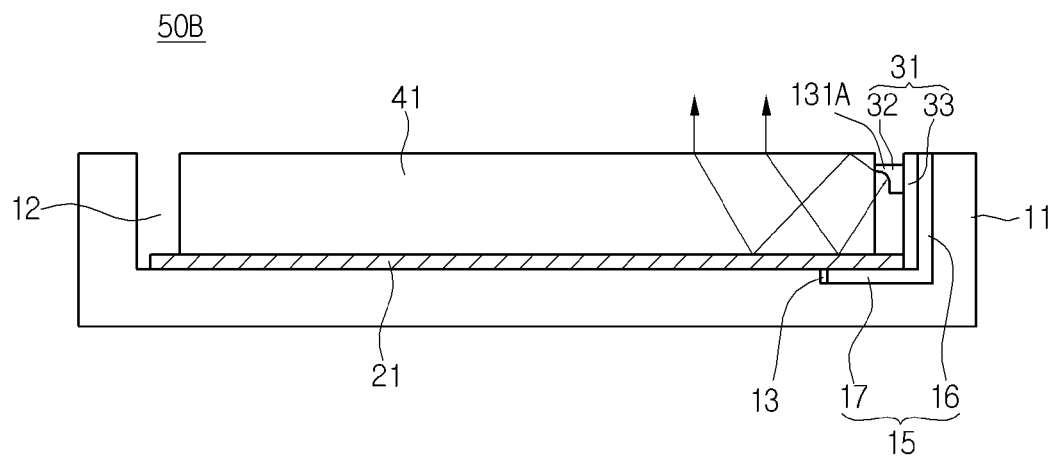
FIG. 7 is a side sectional view showing a light unit according to a third embodiment.

FIG. 7 is a side sectional view showing a light unit 50B according to a third embodiment. In the following description about the third embodiment, the structure and the components identical to those of the embodiments will not be further described.

Referring to FIG. 7, the light unit 50B includes a heat radiation plate 15 interposed between the board 33 and the bottom cover 11.

The heat radiation plate 15 includes a side part 16 and a bottom part 17. The heat radiation plate 15 may include a metallic material representing superior thermal conductivity.

The side part 16 of the heat radiation plate 15 may be attached to the bottom cover 17 or may be screwed with the bottom cover 11. The board 33 is coupled with the front surface of the side part 16, and a used coupling member includes a screw or an adhesive agent.

The bottom cover 11 of the heat radiation plate 15 is bent from the side part 16, and coupled with a groove 13 of the bottom cover 11. The groove 13 may have a stepped structure from a bottom surface of the bottom cover 11. The bottom part 17 may radiate heat transferred from the side part 16 through the bottom cover 11, or may make contact with an additional heat radiation member to radiate the heat.

The light unit 50B effectively radiates heat emitted from the light emitting device 32 through the heat radiation plate 15, so that the reliability for the light emitting module 31 and the light unit 50B can be improved. The heat radiation member further includes a heat pipe making contact with the lower surface of the heat radiation plate 15, so that heat can be more effectively radiated.

Figure 8:
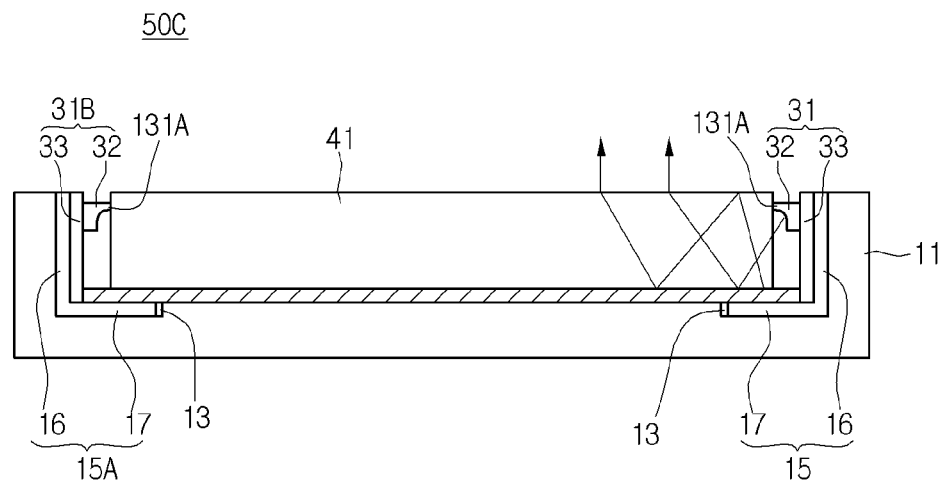
FIG. 8 is a side sectional view showing a light unit according to a fourth embodiment.

FIG. 8 is a side sectional view showing a light unit 50C according to a fourth embodiment. In the following description about the fourth embodiment, the structure and the components identical to those of the embodiments will not be further described.

Referring to FIG. 8, the light unit 50C includes light emitting modules 31 and 31B provided at both sides of the light guide plate 41. Both sides of the light guide plate 41 may include different surfaces. Preferably, the both sides of the light guide plate 41 are opposite to each other. The light emitting modules 31 and 31B can supply lights to both sides of the light guide plate 41.

Boards 33 of the light emitting modules 31 and 31B make contact with heat radiation plates 15 and 15A. The heat radiation plates 15 and 15A support the boards 33 of the light emitting modules 31 and 31B. The heat radiation plates 15 and 15A may perform self-heat radiation, or may transfer heat to elements such as the bottom cover 11 or a heat pipe.

The protrusion 131A of the light emitting device 32 reflects a light which is emitted from the light emitting device 32 and directed upward without being incident onto the light guide plate 41. Accordingly, light leakage or light loss between the light guide plate 41 and the light emitting device 32 can be reduced.

According to another embodiment, the light emitting modules 31 and 31B may be provided on at least two lateral surfaces of the light guide plate 41 without the heat radiation plates 15 and 15A. The light emitting modules 31 and 31B may be provided two facing surfaces, four lateral surfaces, and two lateral surfaces perpendicular to each other from among four lateral surfaces of the light guide plate 41.

Figure 9:
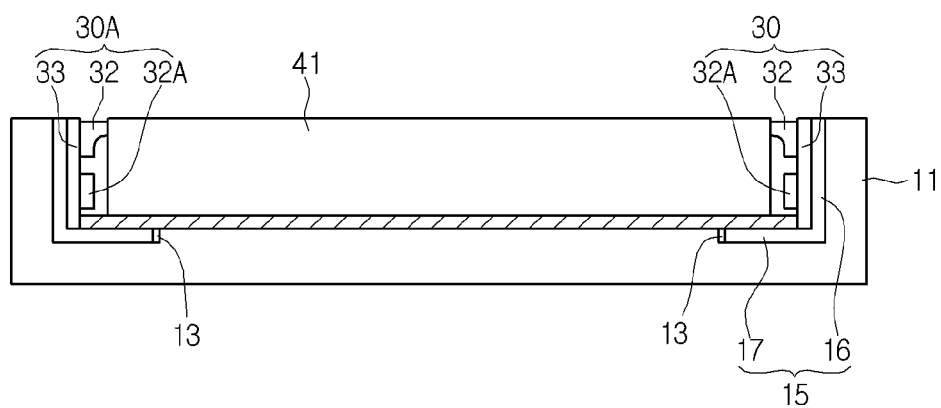
FIG. 9 is a side sectional view showing a light unit according to a fifth embodiment.

FIG. 9 is a side sectional view showing a light unit 50D according to a fifth embodiment. In the following description about the fifth embodiment, the structure and the components identical to those of the embodiments will not be further described.

Referring to FIG. 9, the light unit 50D includes the light emitting modules 30 and 30A provided at both lateral surfaces of the light guide plate 41.

The light emitting modules 30 and 30A include the first light emitting device provided at an upper portion thereof and the second light emitting device 32A disposed at a lower portion thereof. The first light emitting device 32 includes the protrusion 131A as shown in FIG. 3. The second light emitting device 32A has no protrusion of the first light emitting device 32. In the light emitting modules 30 and 30A, the brightness can be improved by using the light emitting devices 32 and 32A provided in a plurality of rows, and the first light emitting device 32 is provided at an upper portion, thereby preventing a light directed upward from leaking.

Figure 10:
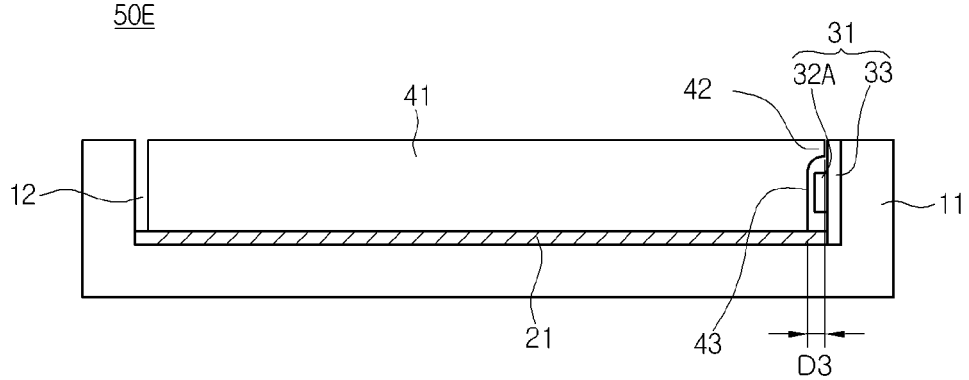
FIG. 10 is a side sectional view showing a light unit according to a sixth embodiment.
Figure 11:
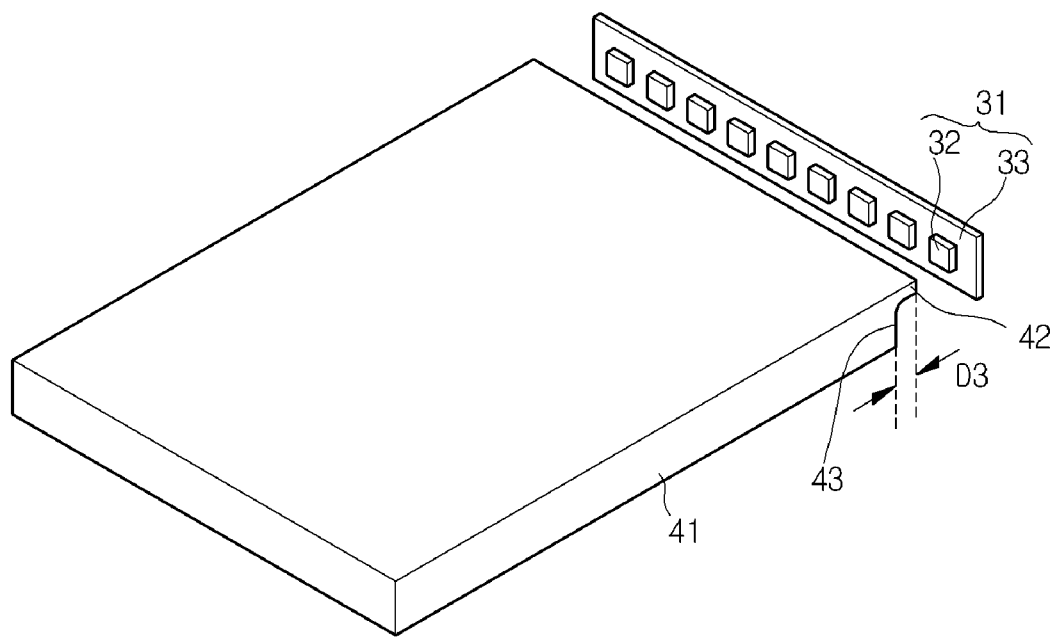
FIG. 11 is an exploded perspective view showing a light emitting module and a light guide plate of FIG. 10.

FIG. 10 is a side sectional view showing a light unit 50E according to a sixth embodiment, and FIG. 11 is an exploded perspective view showing the light emitting module and the light guide plate of FIG. 10. In the following description bout the sixth embodiment, the structure and the components identical to those of the embodiments will not be further described.

Referring to FIGS. 10 and 11, the light unit 50 includes a reflective member 21 disposed on a bottom cover 11 and a light guide plate 41 disposed on the reflective member 21. The light guide plate 41 has a light incident part having a protrusion 42.

The protrusion 42 of the light guide plate 41 protrudes from an upper portion of one lateral surface of the light guide plate 41. The protrusion 42 may protrude outward or toward the light emitting device. The protrusion 42 of the light guide plate 41 may have a same length with a length of one lateral surface 43 of the light guide plate 41.

A width D3 of the protrusion 42 of the light guide plate 41 is a distance between one flat lateral surface 43 and the protrusion 42 of the light guide plate 41, and may be greater than the thickness of the light emitting device 32.

The light emitting device 32 is provided under the protrusion 42 of the light guide plate 41. The protrusion 42 of the light guide plate 41 extends above the light emitting devices 32. The protrusion 42 has a flat top surface and a curved bottom surface, or an inclined bottom surface.

The protrusion 42 of the light guide plate 41 can prevent a light emitted from the light emitting device 32 from leaking between the light guide plate 41 and the light emitting device 32.

The protrusion 42 of the light guide plate 41 may make contact with the front surface of the board 33 having the light emitting device 32 to cover the light emitting devices 32. The protrusion 42 is formed at an upper end of one lateral surface of the light guide plate 41, so that a light incident into the protrusion 42 can be guided into the light guide plate 41. Accordingly, the protrusion 42 of the light guide plate 42 prevents the incident light from leaking toward the protrusion 42, so that an additional anti-light leakage plate is not required.

Figure 12:
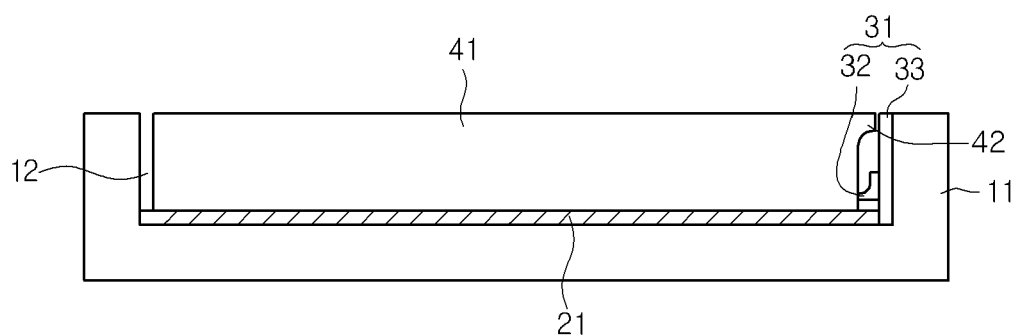
FIG. 12 is a side sectional view showing a light unit according to a seventh embodiment.

FIG. 12 is a side sectional view showing a light unit according to a seventh embodiment. In the following description bout the seventh embodiment, the structure and the components identical to those of the embodiments will not be further described.

Referring to FIG. 12, the light emitting device 32 having a protrusion (See FIG. 5) disposed at a lower portion of a lateral surface of the light guide plate 42. The protrusion 42 of the light guide plate 41 may make contact with the front surface of the board 33. The protrusion 42 of the light guide plate 41 and the protrusion of the light emitting device 32 face each other. A light emitting from the light emitting device 32 may be reflected by the protrusion 42 of the light guide plate 41 and the protrusion of the light emitting device 32.

Figure 13:
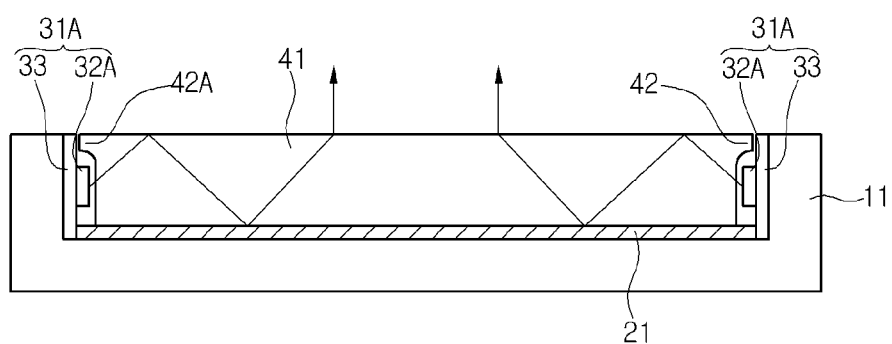
FIG. 13 is a side sectional view showing a light unit according to a eighth embodiment.

FIG. 13 is a side sectional view showing a light unit according to a eighth embodiment.

Referring to FIG. 13, the light unit includes protrusions 42 and 42A disposed at both sides of the light guide plate 41. The light emitting devices 32 of the light emitting modules 31 and 31A are provided under the protrusions 42 and 42A.

The protrusions 42 and 42A are formed at upper ends of both lateral surfaces of the light guide plate 41, so that an additional anti-light leakage plate is not required, and the loss of lights emitted from the light emitting devices 32 provided at both sides of the light guide plate 41 can be reduced.

Figure 14:
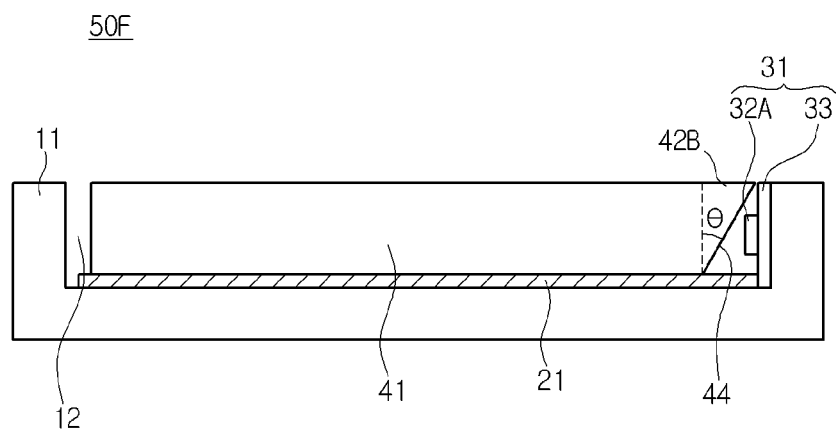
FIG. 14 is a side sectional view showing a light unit according to an ninth embodiment.

FIG. 14 is a side sectional view showing a light unit 50F according to an ninth embodiment.

Referring to FIG. 14, the light unit 50F includes the light guide plate 41 having one inclined lateral surface 44 to perform a light guide function. The lateral surface 44 of the light guide plate 41 is inclined at a predetermined angle θ about a normal axis to a bottom surface of the light guide plate 41. The angle θ is in the range of about 10° to about 70°. Accordingly, the bottom surface of the light guide plate 41 has a length shorter than that of the top surface of the light guide plate 41.

The light emitting device 32 faces the lateral surface 44 of the light guide plate 41, so that the light emitted from the light emitting device 32 is incident into the light guide plate 41 through the lateral surface 44. Accordingly, the leakage of the light directed upward from the light guide plate 41 can be reduced.

The embodiment may be selectively applicable to another embodiment. In other words, a protrusion is formed on one of the light guide plate and the light emitting device to guide a light toward the light incident part of the light guide plate. Accordingly, light leakage can be reduced.

According to another embodiment, the light emitting device is attached to an internal lateral surface of the bottom cover without a substrate, so that heat radiation efficiency can be improved, the coupling process of the substrate can be omitted, and the information display region of the display panel can be expanded.

According to the embodiment, a protrusion is provided in a light exit region of the light emitting device, so that the path of a light directed toward the protrusion can be changed. According to the embodiment, light loss can be reduced in the edge-type light unit. According to the embodiment, light loss can be reduced by using the reflective sheet without the arrangement of an additional reflective frame in the vicinity of the light emitting module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising;
a body having a cavity;
a protrusion formed at a portion of a top surface of the body;
a plurality of lead electrodes in the cavity; and
a light emitting diode disposed in the cavity and electrically connected to the plurality of lead electrodes,
wherein the protrusion is protruded from a portion of the top surface of the body,
wherein the protrusion includes a lower portion adjacent to the cavity and an upper portion connected to the lower portion,
wherein the lower portion of the protrusion has a width wider than a width of the upper portion of the protrusion,
wherein the width of the protrusion is an interval between an outer lateral surface of the protrusion and an internal lateral surface of the protrusion,
wherein the body is disposed around the cavity,
wherein the plurality of lead electrodes includes a first and second lead electrodes coupled to the body,
wherein the first and second lead electrodes are spaced apart from each other,
wherein the body includes a first lateral surface opposite to a second lateral surface, and a third lateral surface opposite to a fourth lateral surface which is adjacent to the first and second lateral surfaces,
wherein the top surface of the body includes top regions between the cavity and the first to third lateral surfaces,
wherein the top regions of the top surface of the body are located at a position lower than a top surface of the protrusion,
wherein the protrusion is vertically protruded from a region between the cavity and the fourth lateral surface, and
wherein an entire region of the protrusion does not vertically overlap with an entire region of the light emitting diode.

2. The light emitting device of claim 1, wherein the outer lateral surface of the protrusion is formed in a same plane with at least one of the first to fourth lateral surfaces of the body.

3. The light emitting device of claim 1, wherein the protrusion has a top surface located at a height higher than the top surface of the body, and
wherein the top surface of the body is flat and has an area greater than an area of the top surface of the protrusion.

4. The light emitting device of claim 1, wherein the cavity includes a resin member, and
wherein the resin member contacts a lateral surface of the cavity.

5. The light emitting device of claim 1, wherein an internal lateral surface of the lower portion of the protrusion is extended from a lateral surface of the cavity.

6. The light emitting device of claim 5, wherein the lateral surface of the cavity is inclined with respect to a bottom surface of the body, and the internal lateral surface of the lower portion of the protrusion is inclined with respect to a bottom surface of the body.

7. The light emitting device of claim 1, wherein the protrusion has a length equal to a length of the fourth lateral surface of the body.

8. The light emitting device of claim 1, wherein the protrusion includes a same material with a material of the body, and
wherein the body includes a resin material.

9. The light emitting device of claim 1, wherein the height of the protrusion is greater than a thickness of the body.

10. The light emitting device of claim 1, wherein the internal lateral surface of the protrusion is inclined with respect to a bottom surface of the body.

11. The light emitting device of claim 10, wherein the internal lateral surface of the protrusion is connected to the lateral surface of the cavity.

12. The light emitting device of claim 1, wherein the outer lateral surface of the protrusion is formed in a same plane with at least one of the first and second lateral surfaces of the body.

13. The light emitting device of claim 1, wherein each of the plurality of lead electrodes includes a top surface disposed at a bottom surface of the cavity and a bottom surface opposite to the top surface of each of the plurality of lead electrodes,
wherein an outer part of the first lead electrode is exposed on the first lateral surface of the body,
wherein an outer part of the second lead electrode is exposed on the second lateral surface of the body, and
wherein the rotrusion is vertically overlapped with at least one of the first and second lead frames and is not vertically overlapped with an entire region of the cavity.

14. A light unit comprising:
a light guide plate;
a light emitting module including a plurality of light emitting devices facing at least one of outer lateral surfaces of the light guide plate and a board having the plurality of light emitting devices mounted thereon; and
a reflective member under the light guide plate,
wherein the light emitting device includes:
a body having a cavity with an opened upper portion;
a protrusion protruding from an upper portion of the body;
a plurality of lead electrodes in the cavity; and
a light emitting diode disposed in the cavity and electrically connected to the plurality of lead electrodes, and
wherein the protrusion and the cavity of the light emitting device faces at least one of the outer lateral surfaces of the light guide plate,
wherein the protrusion is protruded from a portion of a top surface of the body,
wherein the protrusion includes a lower portion adjacent to the cavity and an upper portion connected to the lower portion inclined from the top surface of the body,
wherein the lower portion of the protrusion has a width wider than a width of the upper portion of the protrusion,
wherein the width of the protrusion is an interval between an outer lateral surface of the protrusion and an internal lateral surface of the protrusion,
wherein the body is disposed around the cavity,
wherein the plurality of lead electrodes includes a first and second lead electrodes coupled to the body,
wherein the first and second lead electrodes are spaced apart from each other,
wherein the body includes a first lateral surface opposite to a second lateral surface, and a third lateral surface opposite to a fourth lateral surface which is adjacent to the first and second lateral surfaces,
wherein the top surface of the body includes top regions between the cavity and the first to third lateral surfaces,
wherein the top regions of the top surface of the body are located at a position lower than a top surface of the protrusion,
wherein the protrusion is vertically protruded from a region between the cavity and the fourth lateral surface, and
wherein an entire region of the protrusion does not vertically overlap with an entire region of the light emitting diode.

15. The light unit of claim 14, wherein the protrusion of the light emitting device makes contact with an upper portion or a lower portion of at least one of the outer lateral surfaces of the light guide plate.

16. The light unit of claim 14, wherein the light emitting module includes a first light emitting module provided at a first lateral surface of the light guide plate; and a second light emitting module provided at a second lateral surface of the light guide plate.

17. The light unit of claim 14, further comprising a bottom cover having a recess part to receive the reflective member, the light guide plate, and the light emitting module.

18. The light unit of claim 17, further comprising a heat radiation plate interposed between the board and the bottom cover.

19. The light unit of claim 14, wherein the light emitting device includes a first light emitting device provided at an upper portion of the board and a second light emitting device provided at a lower portion of the board.

20. The light unit of claim 19, wherein internal lateral surfaces of protrusions of the first and second light emitting devices face each other.

* * * * *